US009065455B2

(12) United States Patent
Na et al.

(10) Patent No.: US 9,065,455 B2
(45) Date of Patent: Jun. 23, 2015

(54) DELAY LOCKED LOOP CIRCUIT AND SEMICONDUCTOR MEMORY DEVICE INCLUDING THE SAME

(71) Applicant: Samsung Electronics Co., Ltd., Suwon-Si, Gyeonggi-Do (KR)

(72) Inventors: Tae-sik Na, Seoul (KR); Seok-hun Hyun, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 143 days.

(21) Appl. No.: 13/777,232

(22) Filed: Feb. 26, 2013

(65) Prior Publication Data

US 2013/0223179 A1 Aug. 29, 2013

(30) Foreign Application Priority Data

Feb. 28, 2012 (KR) ........................ 10-2012-0020400

(51) Int. Cl.
| | |
|---|---|
| G11C 8/00 | (2006.01) |
| H03L 7/18 | (2006.01) |
| G11C 8/18 | (2006.01) |
| G11C 7/22 | (2006.01) |
| H03L 7/081 | (2006.01) |

(52) U.S. Cl.
CPC .. *H03L 7/18* (2013.01); *G11C 8/18* (2013.01); *G11C 7/222* (2013.01); *H03L 7/0812* (2013.01)

(58) Field of Classification Search
CPC ............ G11C 8/18; G11C 7/222; H03L 7/18; H03L 7/0812

USPC ................................ 365/233.1, 233.12, 233.5
See application file for complete search history.

(56) References Cited

U.S. PATENT DOCUMENTS

| | | | | |
|---|---|---|---|---|
| 6,137,328 | A * | 10/2000 | Sung | 327/158 |
| 6,828,835 | B2 * | 12/2004 | Cho | 327/158 |
| 6,989,700 | B2 * | 1/2006 | Kim | 327/158 |
| 7,076,013 | B2 * | 7/2006 | Cho | 375/354 |
| 7,098,712 | B2 * | 8/2006 | Lee | 327/161 |
| 7,259,604 | B2 * | 8/2007 | Gomm | 327/175 |
| 7,368,964 | B2 * | 5/2008 | Kim et al. | 327/158 |
| 7,388,415 | B2 * | 6/2008 | Lee | 327/158 |
| 7,612,591 | B2 * | 11/2009 | Kim | 327/158 |
| 7,751,261 | B2 * | 7/2010 | Cho | 365/194 |
| 8,269,534 | B2 * | 9/2012 | Kim | 327/158 |
| 8,384,454 | B2 * | 2/2013 | Lai et al. | 327/157 |
| 2007/0188206 | A1 | 8/2007 | Lee | |
| 2008/0001642 | A1* | 1/2008 | Yun et al. | 327/161 |
| 2008/0211553 | A1 | 9/2008 | Kim et al. | |
| 2009/0256603 | A1 | 10/2009 | Choi | |
| 2010/0201414 | A1 | 8/2010 | Oh | |
| 2011/0001532 | A1 | 1/2011 | Seo | |
| 2011/0109357 | A1 | 5/2011 | Kim | |
| 2011/0156766 | A1 | 6/2011 | Ahn et al. | |

\* cited by examiner

*Primary Examiner* — Viet Q Nguyen
(74) *Attorney, Agent, or Firm* — Harness, Dickey & Pierce, P.L.C.

(57) ABSTRACT

A delay locked loop (DLL) circuit having improved noise characteristics. The DLL circuit includes a first divider for generating a first divided signal by dividing an external clock; a second divider for generating a second divided signal by dividing an internal clock; a phase detector for detecting a phase difference between the first divided signal and the second divided signal; and an adjusting unit for synchronizing the internal clock and the external clock, based on the phase difference.

19 Claims, 18 Drawing Sheets

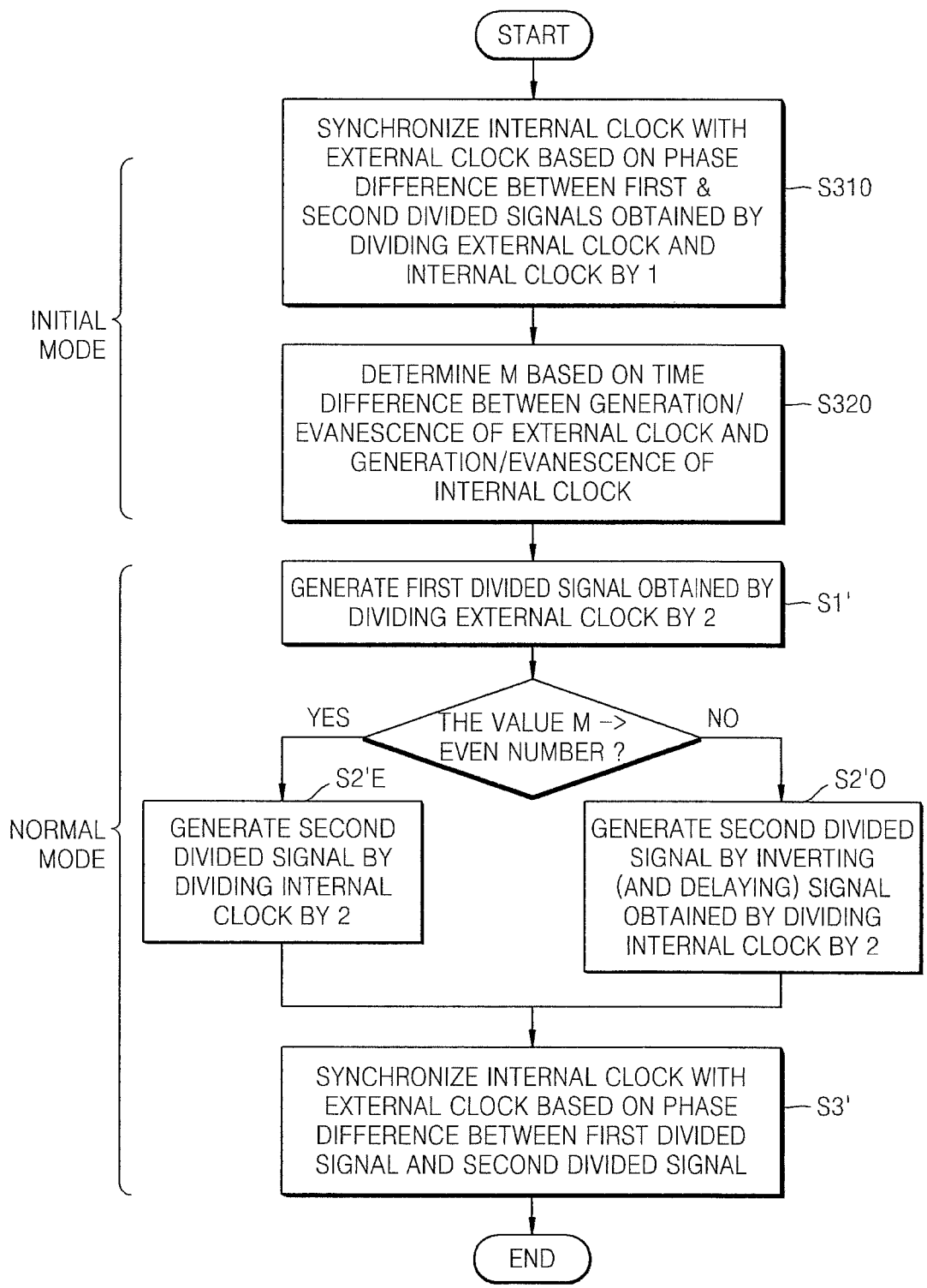

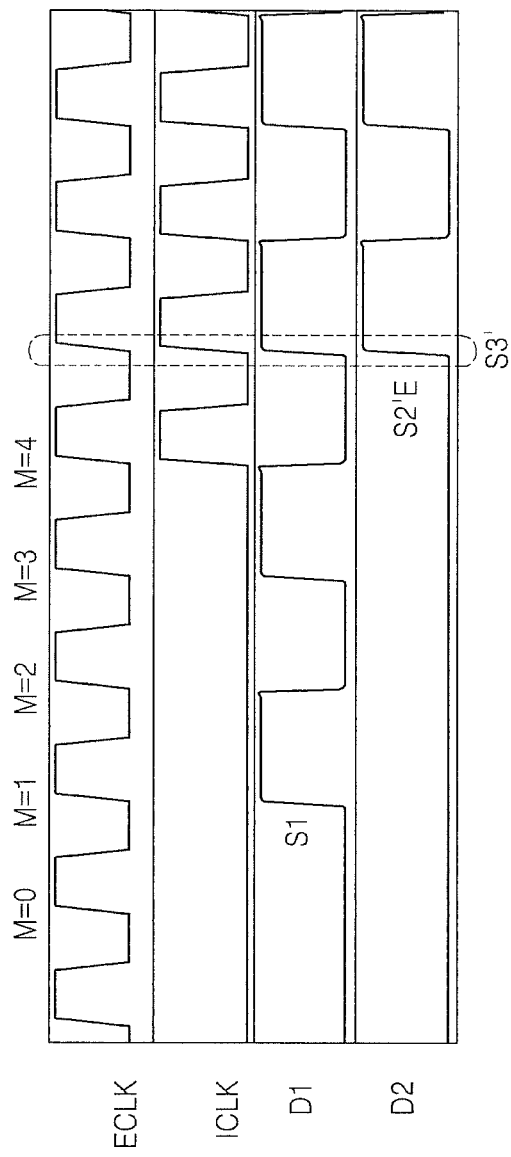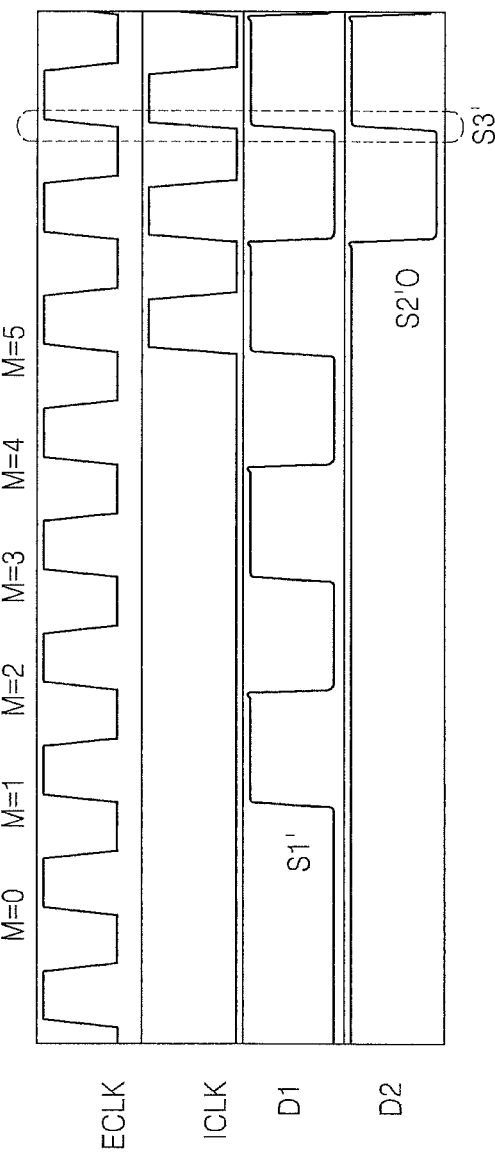

DELAY LOCKED LOOP CIRCUIT AND SEMICONDUCTOR MEMORY DEVICE INCLUDING THE SAME

CROSS-REFERENCE TO RELATED APPLICATIONS

This application claims the benefit of Korean Patent Application No. 10-2012-0020400, filed on Feb. 28, 2012, in the Korean Intellectual Property Office, the disclosure of which is incorporated herein in its entirety by reference.

BACKGROUND

The inventive concepts relate to a delay locked loop (DLL) circuit and a semiconductor memory device including the DLL circuit.

In a system or a circuit, a clock is used as a reference to synchronize operation timings and is used to assure a fast operation without an error. When a clock that is input from an external source is used in a device, a clock skew may occur due to a delay caused by the internal circuitry of the device. In order to allow an internal clock and an external clock to have the same phase a DLL circuit may be used to compensate for the clock skew. However, when a conventional DLL circuit is used to compensate for the clock skew, in certain cases, the internal clock may become a full pulse ahead or behind the external clock.

SUMMARY

According to an example embodiment of the inventive concepts, there is provided a delay locked loop (DLL) circuit including a first divider configured to generate a first divided signal by dividing an external clock; a second divider configured to generate a second divided signal by dividing an internal clock; a phase detector configured to detect a phase difference between the first divided signal and the second divided signal; and an adjusting unit configured to synchronize the internal clock and the external clock, based on the phase difference.

The first divider may divide the external clock by a same division value that the second divider divides the internal clock.

The first divider may generate the first divided signal by dividing the external clock by M and the second divider may generate the second divided signal by dividing the internal clock by M (where, M is a natural number greater than 2).

The first divided signal and the second divided signal may be synchronized at an M+1th rising edge of the external clock.

The first divider may divide the external clock by 1 in an initial mode and may divide the external clock by M in a normal mode, and the second divider may divide the internal clock by 1 in the initial mode and may divide the internal clock by M in the normal mode.

A value of M may correspond to a time difference between generation or evanescence of the external clock and generation or evanescence of the internal clock.

The DLL circuit may further include a measuring unit configured to generate the value of M using information regarding the time difference by measuring the generation or the evanescence of the external clock and the generation or the evanescence of the internal clock, and send the value of M to the first divider and the second divider, the first divider may divide the external clock by the M, and the second divider may divide the internal clock by the M.

The adjusting unit may include a delay unit configured to generate the internal clock as a delayed version of the external clock; and a control unit configured to control the delay unit based on the phase difference.

The DLL circuit may further include a replica unit configured to delay the internal clock. In this case, the replica unit may be connected between the phase detector and the second divider, and selectively, the second divider may be connected between the phase detector and the replica unit.

The DLL circuit may further include a clock tree configured to generate a DLL clock as a delayed version of the internal clock, and the replica unit may include a clock tree replica configured to delay the internal clock by a delay by the clock tree.

According to another example embodiment of the inventive concepts, there is provided a semiconductor memory device including a delay locked loop (DLL) circuit configured to generate an internal clock synchronized with an external clock at an output terminal; and an input/output circuit configured to input and output data, in response to the internal clock, wherein the DLL circuit includes a first divider configured to generate a first divided signal by dividing an external clock; a second divider configured to generate a second divided signal by dividing an internal clock; a phase detector configured to detect a phase difference between the first divided signal and the second divided signal; and an adjusting unit configured to synchronize the internal clock with the external clock, based on the phase difference.

The first divider may divide the external clock by 1 in an initial mode and may divide the external clock by 2 in a normal mode, and the second divider may divide the internal clock by 1 in the initial mode and may divide the internal clock by 2 in the normal mode.

The second divider may be configured to generate the second divided signal, in the normal mode, by dividing the internal clock by 2, if a value obtained by dividing a time difference between generation or evanescence of the external clock and generation or evanescence of the internal clock by a clock period of the external clock is an even number, the second divider may be configured to and generate the second divided signal by inverting a signal obtained by dividing the internal clock by 2, if when the value that is obtained by dividing the time difference between the generation or the evanescence of the external clock and the generation or the evanescence of the internal clock by the clock period of the external clock is an odd number.

According to another example embodiment, there is provided a skew correcting circuit configured to receive an external clock and output an internal clock. The skew correcting circuit includes a divider configured to divide an operating period of the external clock to generate a first divided clock signal and the divider is configured to divide an operating period of the internal clock to generate a second divided clock signal; a phase detector configured to detect a phase difference between the first divided signal and the second divided signal; and an adjusting unit configured to synchronize the internal clock and the external clock by adjusting a phase of the internal clock based on the phase difference between the first divided clock signal and the second divided clock signal.

BRIEF DESCRIPTION OF THE DRAWINGS

Example embodiments of the inventive concepts will be more clearly understood from the following detailed description taken in conjunction with the accompanying drawings in which:

FIG. 16 is a flowchart of a method of operating a DLL circuit, according to another embodiment of the inventive concepts;

FIGS. 17 and 18 are timing diagrams of signals obtained by performing the method of FIG. 16;

DETAILED DESCRIPTION OF THE EMBODIMENTS

Figure 1:
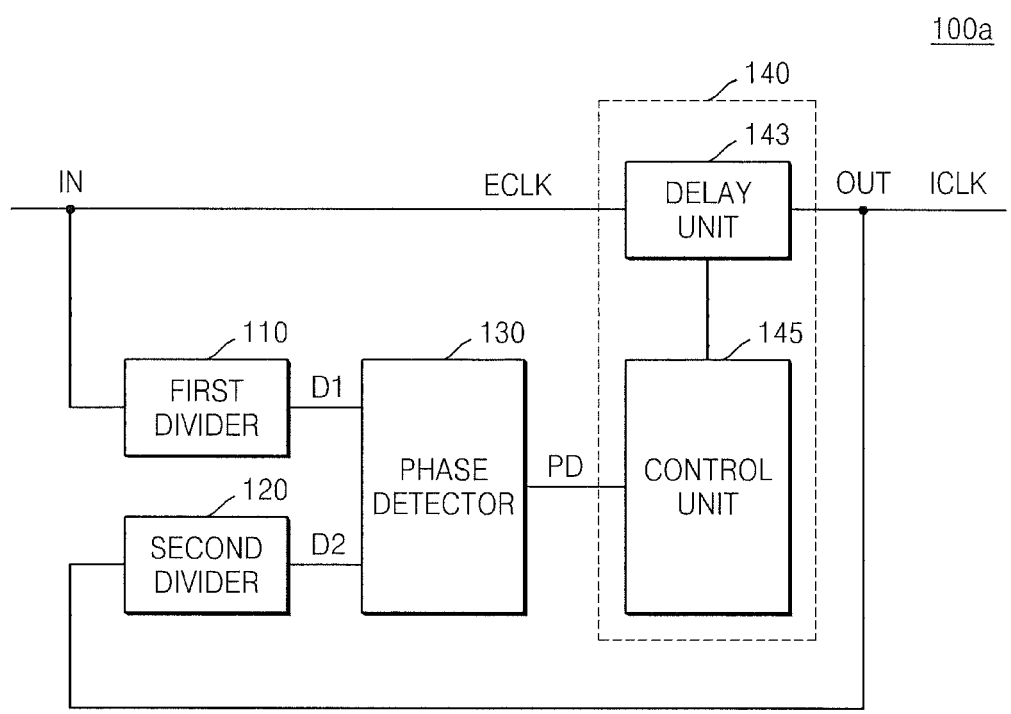
FIG. 1 is a block diagram of a delay locked loop (DLL) circuit according to an embodiment of the inventive concepts.

Hereinafter, the inventive concepts will be described in detail by explaining example embodiments of the inventive concepts with reference to the attached drawings. The inventive concepts may, however, be embodied in many different forms and should not be construed as being limited to the embodiments set forth herein; rather, these embodiments are provided so that this disclosure will be thorough and complete, and will fully convey the inventive concepts to those of ordinary skill in the art.

Furthermore, all examples and conditional language recited herein are to be construed as being without limitation to such specifically recited examples and conditions. Throughout the specification, a singular form may include plural forms, unless there is a particular description contrary thereto. Also, terms such as "comprise" or "comprising" are used to specify existence of a recited form, a number, a process, an operations, a component, and/or groups thereof, not excluding the existence of one or more other recited forms, one or more other numbers, one or more other processes, one or more other operations, one or more other components and/or groups thereof. Throughout the specification, a term "and/or" includes at least one from among all listed components and one or more combinations of all listed components.

While terms "first" and "second" are used to describe various components, parts, regions, layers and/or portions, it is obvious that the components, parts, regions, layers and/or portions are not limited to the terms "first" and "second". The terms "first" and "second" are used only to distinguish between each of components, each of parts, each of regions, each of layers and/or each of portions. Thus, throughout the specification, a first component, a first part, a first region, a first layer or a first portion may indicate a second component, a second part, a second region, a second layer or a second portion without conflicting with the inventive concepts.

In addition, relative terms such as "lower" or "bottom", and "upper" or "top" may be used to describe relationship between elements as illustrated in the drawings. These relative terms can be understood to include different directions in addition to the described directions illustrated in the drawings. For example, when elements are turned over in the drawings, elements described to be on lower surfaces of other elements are formed on upper surfaces of the other elements. Therefore, the term "lower" depends only on a predetermined direction and can include both "upper" and "lower" directions. Similarly, when a device is turned over in one of the drawings, elements which are described to be "below or beneath" some other elements are then "above" of the other elements. Accordingly, the term "below" can include both directions "above and below".

Hereinafter, the inventive concepts will be described in detail by explaining example embodiments of the inventive concepts with reference to the attached drawings. With respect to the drawings, shapes in the drawings may be revised according to a manufacturing technology and/or a tolerance. Therefore, the attached drawings for illustrating example embodiments of the inventive concepts are referred to in order to gain a sufficient understanding of the inventive concepts, the merits thereof, and the objectives accomplished by the implementation of the inventive concepts. Like reference numerals in the drawings denote like elements.

FIG. 1 is a block diagram of a delay locked loop (DLL) circuit 100a according to an embodiment of the inventive concepts.

Referring to FIG. 1, the DLL circuit 100a may be formed in such a manner that an external clock ECLK is input via an input terminal IN and then an internal clock ICLK that is synchronized with the external clock ECLK is generated at an output terminal OUT. In more detail, the DLL circuit 100a may include a first divider 110, a second divider 120, a phase detector 130, and an adjusting unit 140.

The first divider 110 may generate a first divided signal D1 by dividing the external clock ECLK. Also, the second divider 120 may generate a second divided signal D2 by dividing the internal clock ICLK. The division level at which the external clock ECLK is divided by the first divider 110 may be equal to the division level at which the internal clock ICLK is divided by the second divider 120.

The phase detector 130 may detect a phase difference PD between the first divided signal D1 and the second divided signal D2 and then may transmit the phase difference PD to the adjusting unit 140. For example, the phase difference PD may be a result value obtained by latching the external clock ECLK at a rising edge of the internal clock ICLK, and the phase detector 130 may transmit the result value as the phase difference PD to the adjusting unit 140.

For example, the case where the result value that is obtained by latching (or sampling) the external clock ECLK at the rising edge of the internal clock ICLK is 1 may mean that a phase of the internal clock ICLK is faster than a phase of the external clock ECLK. Also, the case where the result value that is obtained by latching(or sampling) the external clock ECLK at the rising edge of the internal clock ICLK is 0 may mean that the phase of the internal clock ICLK is slower than the phase of the external clock ECLK.

The adjusting unit 140 may synchronize the internal clock ICLK with the external clock ECLK, according to the phase difference PD. The adjusting unit 140 may include a delay unit 143 and a control unit 145. The delay unit 143 may generate the internal clock ICLK by delaying the external clock ECLK. The control unit 145 may control the delay unit 143 according to the phase difference PD transmitted from the phase detector 130.

For example, when the phase difference PD (e.g., the result value) transmitted from the phase detector 130 is '1', the phase of the internal clock ICLK may be faster than the phase of the external clock ECLK. Thus, in order to generate an internal clock ICLK that is synchronized with the external clock ECLK, the adjusting unit 140 may output a signal formed by delaying the phase of the external clock ECLK. As a result, the internal clock ICLK having a delayed phase may be generated. Afterward, the internal clock ICLK may be applied again to the second divider 120 and then an additional synchronization operation may be performed. As a result, the internal clock ICLK may be synchronized with the external clock ECLK.

On the other hand, when the phase difference PD (e.g., the result value) transmitted from the phase detector 130 is '0', the phase of the internal clock ICLK may be slower than the phase of the external clock ECLK. Thus, in order to generate an internal clock ICLK that is synchronized with the external clock ECLK, the adjusting unit 140 may output a signal formed by advancing the phase of the external clock ECLK. As a result, the internal clock ICLK having an advanced phase may be generated. Afterward, the internal clock ICLK may be applied again to the second divider 120 and then an additional synchronization operation may be performed. As a result, the internal clock ICLK may be synchronized with the external clock ECLK.

In a semiconductor memory devices such as a dynamic random access memory (DRAM), there is a trend to lower an amount of power consumed in the semiconductor memory device. This reduction may be achieved by decreasing a level of an external power voltage, which acts as an operating voltage of the semiconductor memory device. Due to the decreased external power voltage, a level of an internal voltage is also decreased. When the level of the internal voltage is decreased, external noise may have a greater effect on the semiconductor memory device.

Figure 2:
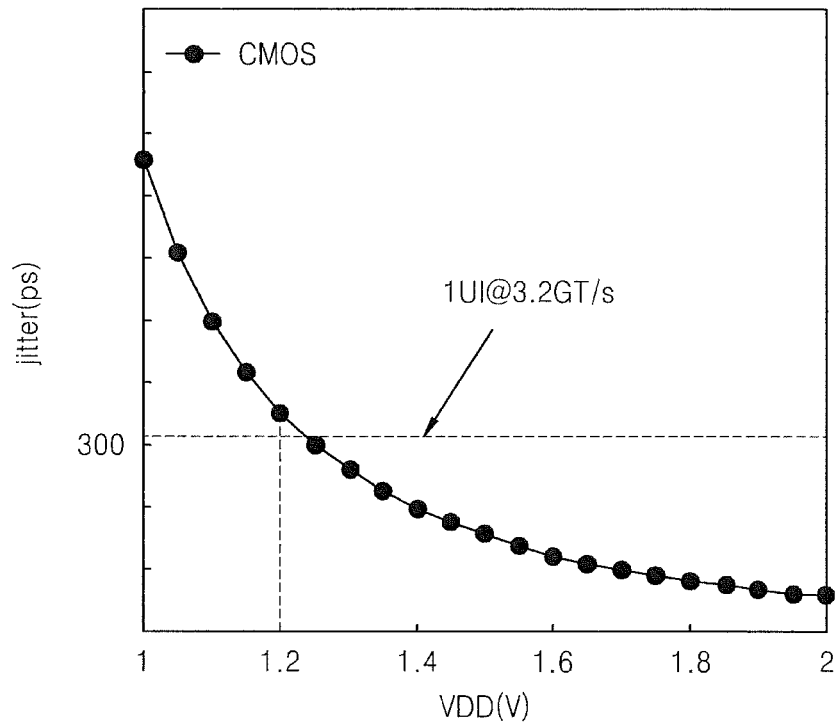
FIG. 2 is a graph showing a noise according to an operation voltage of a semiconductor memory device.

For example, according to the standards of a double data rate 4 (DDR4) memory presented by the Joint Electron Device Engineering Council (JEDEC), the DDR4 memory uses an operation voltage of 1.2 V, and in this case, as shown in a graph of FIG. 2, a jitter equal to or greater than 300 ps may occur. That is, as shown in the graph of FIG. 2, when the operation voltage is decreased, the affect by the external noise may become worse.

Figure 3:
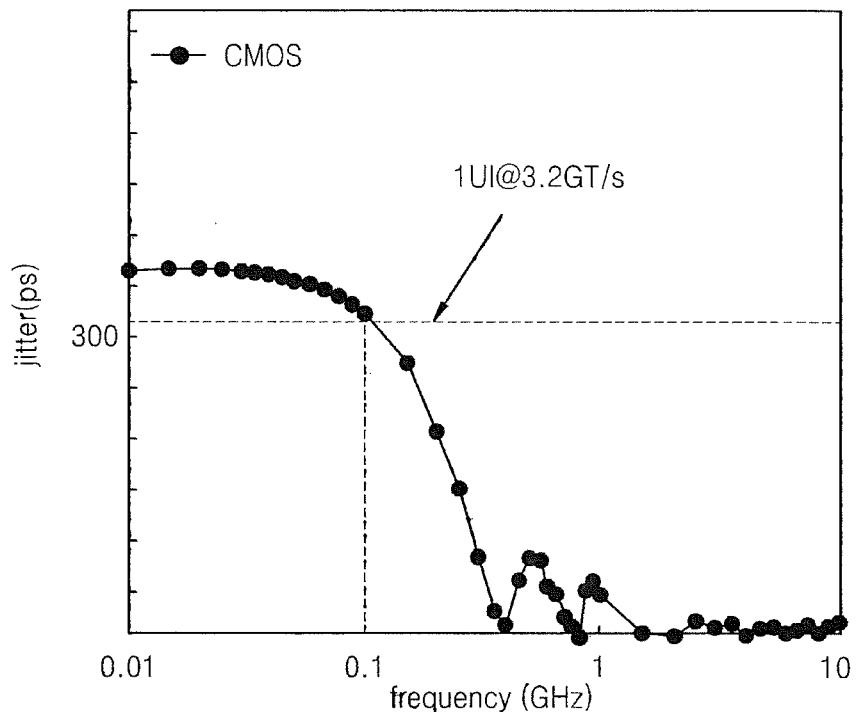
FIG. 3 is a graph showing an effect of noise which is applied to a semiconductor memory device according to a frequency of the noise.

As illustrated in FIG. 3, when a frequency of noise is decreased, the noise further affects the semiconductor memory device. For example, when a noise has a frequency greater than 100 MHz, an affect by the noise on a clock signal may be small, and the noise may be adjusted by a DLL circuit and may not cause a latency problem. However, when a noise has a frequency equal to or less than 100 MHz, the noise creates a jitter equal to or greater than 300 ps, such that a latency problem of the clock signal may occur.

Figure 4:
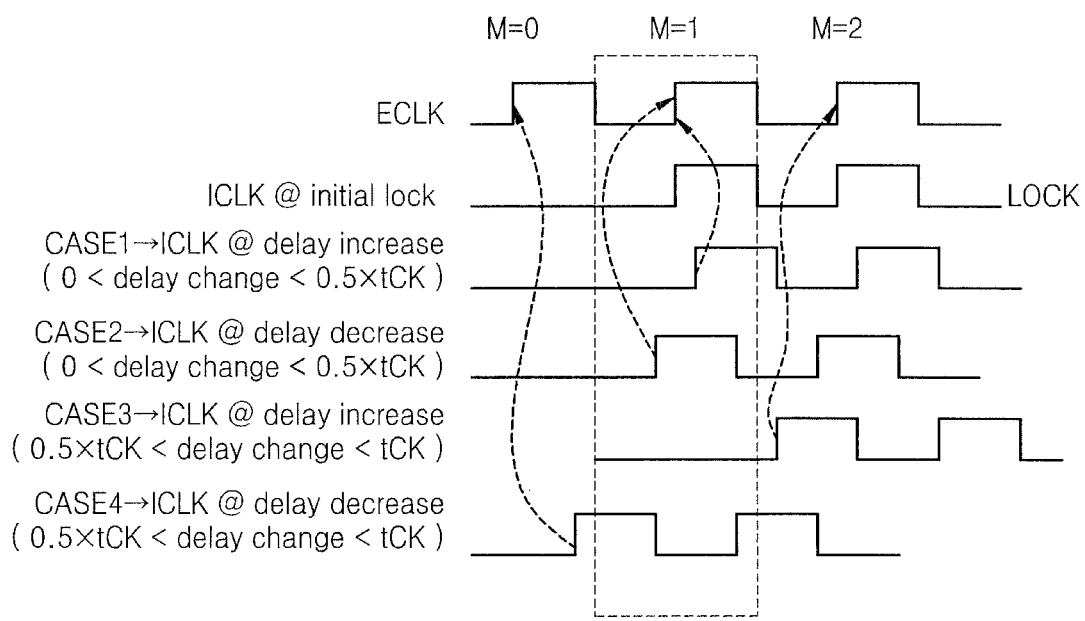
FIG. 4 illustrates an example in which noise having a low frequency causes a latency problem in a semiconductor memory device.

FIG. 4 illustrates an example in which noise having a low frequency causes a latency problem in a semiconductor memory device.

Referring to FIG. 4, in an initial clock period, a first edge of an internal clock ICLK may be synchronized at an M=1 point of an external clock ECLK (i.e., a second edge of the external clock ECLK).

In the CASE 1, although a delay increase of the internal clock ICLK occurs, the delay increase is less than a half (½) of a clock period of an external (or internal) clock, so that a phase of the internal clock ICLK may be synchronized via a delay performed by a delay locked loop (DLL). Thus, the first edge of the internal clock ICLK may be synchronized at the M=1 point of the external clock ECLK (i.e., the second edge of the external clock ECLK), and latency may be maintained.

In the CASE 2, although a delay decrease of the internal clock ICLK occurs, the delay decrease is less than half (½) of the clock period of the external (or internal) clock, so that the phase of the internal clock ICLK may be synchronized via an advancement performed by the DLL. Thus, the first edge of the internal clock ICLK may be synchronized at the M=1 point of the external clock ECLK (i.e., the second edge of the external clock ECLK), and latency may be maintained.

On the other hand, in the CASE 3, when a delay increase of the internal clock ICLK occurs, and the delay increase is equal to or greater than half (½) of the clock period of the external (or internal) clock, the phase of the internal clock ICLK may be advanced by the DLL, such that a latency problem may be incurred. In more detail, because a result value obtained by latching (or sampling) the external clock ECLK at a first rising edge of the internal clock ICLK is 0, it may be determined that the phase of the internal clock ICLK is slower than the phase of the external clock ECLK. Thus, the first edge of the internal clock ICLK may be synchronized at an M=2 point of the external clock ECLK (i.e., a third edge of the external clock ECLK), and as a result, the internal clock may be a full pulse off from the external clock causing the latency problem to occur.

Also, in the CASE 4, when the delay decrease of the internal clock ICLK occurs, and the delay decrease is equal to or greater than half (½) of the clock period of the external (or internal) clock, the phase of the internal clock ICLK may be delayed by the DLL, such that a latency problem may be incurred. In more detail, because the result value obtained by latching (or sampling) the external clock ECLK at the first rising edge of the internal clock ICLK is 1, it may be determined that the phase of the internal clock ICLK is faster than the phase of the external clock ECLK. Thus, the first edge of the internal clock ICLK may be synchronized at the M=0 point of the external clock ECLK (i.e., the first edge of the external clock), and as a result, the internal clock may be a full pulse off from the external clock causing the latency problem to occur.

In view of this undesired latency, the DLL circuit 100a according to one or more embodiments of the inventive concepts performs a synchronization operation according to the first divided signal (D1 of FIG. 1) obtained by dividing the external clock ECLK, and the second divided signal (D2 of FIG. 1) obtained by dividing the internal clock ICLK, so that the aforementioned latency problems, such as the problems illustrated in CASE3 and CASE4 of FIG. 4, may be solved.

Figure 5:
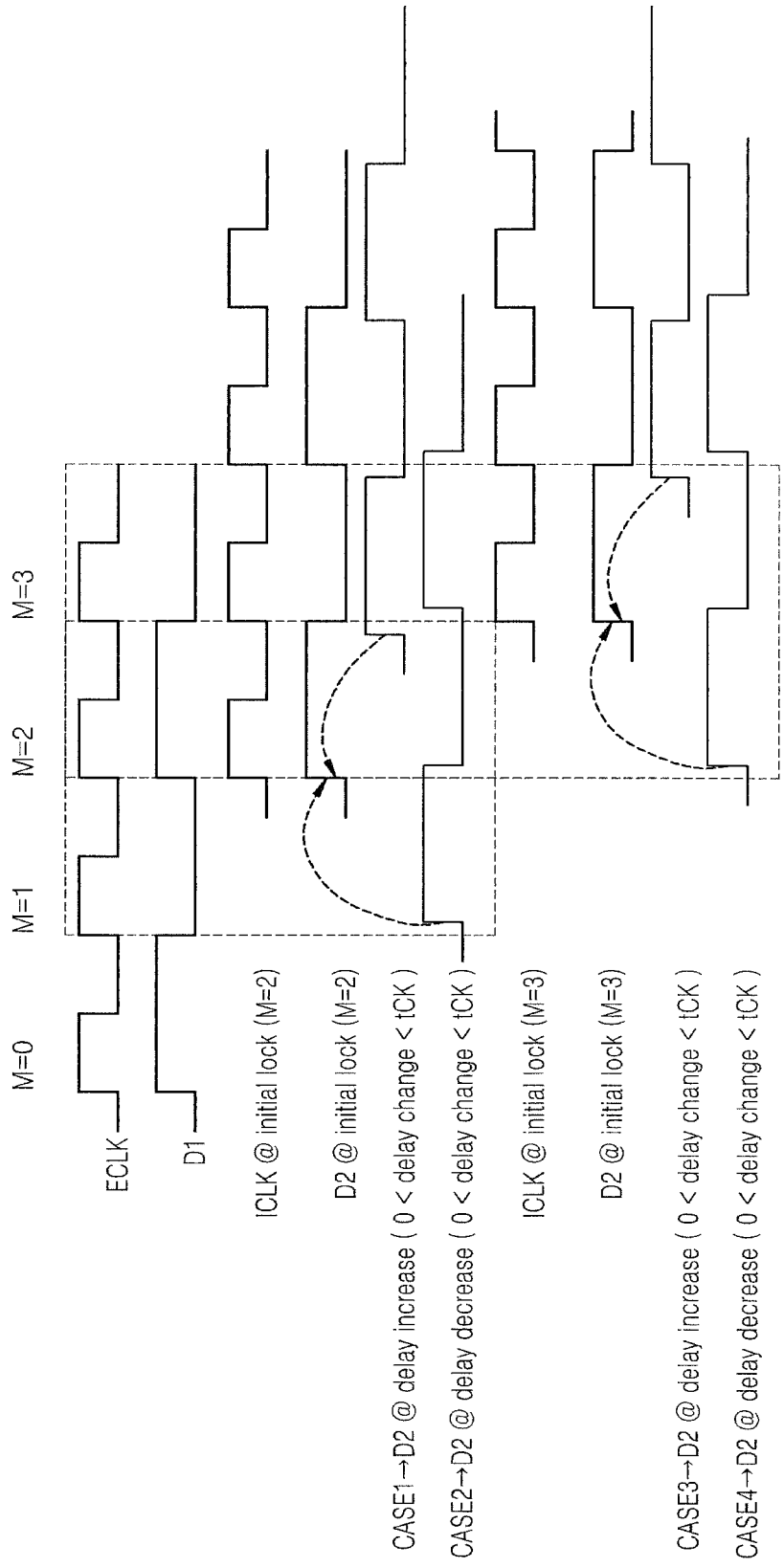
FIG. 5 is a timing diagram of signals obtained by performing a method of operating the DLL circuit of FIG. 1.

In more detail, referring to FIG. 5, a first edge of an internal clock ICLK may be synchronized at an M=2 point of an external clock ECLK (i.e., a third edge of the external clock ECLK). In this case, a first edge of a second divided signal D2 that is obtained by dividing the internal clock ICLK by 2 may also be synchronized at the M=2 point of the external clock ECLK (i.e., the third edge of the external clock ECLK).

In the CASE 1, a delay increase of the internal clock ICLK is equal to or greater than a half (½) of a clock period of an external (or internal) clock. However, in this case, the internal clock ICLK has been divided to form the second divided signal D2 which has a delay increase falling within half (½) of the clock period of the first divided clock D1, therefore a latency problem as that in the CASE 3 of FIG. 4 does not occur. In more detail, because a result value obtained by latching (or sampling) the first divided signal D1 at a first rising edge of the second divided signal D2 is 1, it may correctly be determined that a phase of the internal clock ICLK is faster than a phase of the external clock ECLK. In contrast, in CASE 3 of FIG. 4 there was a mistaken determination that the phase of the internal clock ICLK was slower than the phase of the external clock ECLK. Thus, the second divided clock signal D2 can be delayed, such that a first edge of the second divided signal D2 (and the internal clock ICLK) may be synchronized at the M=2 point of the first divided signal D1 (and the external clock ECLK) (i.e., the third edge of the external clock ECLK), and as a result, latency may be maintained.

Likewise, in the CASE 2, a delay decrease of the internal clock ICLK occurs and the delay decrease is equal to or greater than half (½) of the clock period of the external (or internal) clock. However, in this case, the internal clock ICLK has been divided to form the second divided signal D2 which has a delay increase falling within half (½) of the clock period of the first divided clock D1, therefore a latency problem as that in the CASE 4 of FIG. 4 does not occur. In more detail, because the result value obtained by latching (or sampling) the first divided signal D1 at the first rising edge of the second divided signal D2 is 0, it may be correctly be determined that the phase of the internal clock ICLK is slower than the phase of the external clock ECLK. In contrast, in CASE 4 of FIG. 4 there was a mistaken determination that the phase of the internal clock ICLK was faster than the phase of the external clock ECLK. Thus, the second divided clock signal D2 can be accelerated, such that the first edge of the second divided signal D2 (and the internal clock ICLK) may be synchronized at the M=2 point of the first divided signal D1 (and the external clock ECLK) (i.e., the third edge of the external clock ECLK), and as a result, latency may be maintained.

Likewise, as shown in the CASES 3 and 4 of FIG. 5, when the first edge of the internal clock ICLK is synchronized at an M=3 point of the external clock ECLK (i.e., a fourth edge of the external clock ECLK), a synchronization may be performed according to the first divided signal D1 and the second divided signal D2, and as a result, latency may be maintained. That is, although a delay increase or decrease of the internal clock ICLK occurs, and the delay increase or decrease is equal to or greater than half (½) of the clock period of the external (or internal) clock, as shown in the CASES 3 and 4, the first edge of the second divided signal D2 (and the internal clock ICLK) may be synchronized at the M=3 point of the external clock ECLK (i.e., the fourth edge of the external clock ECLK) and as a result, latency may be maintained.

Figure 6:
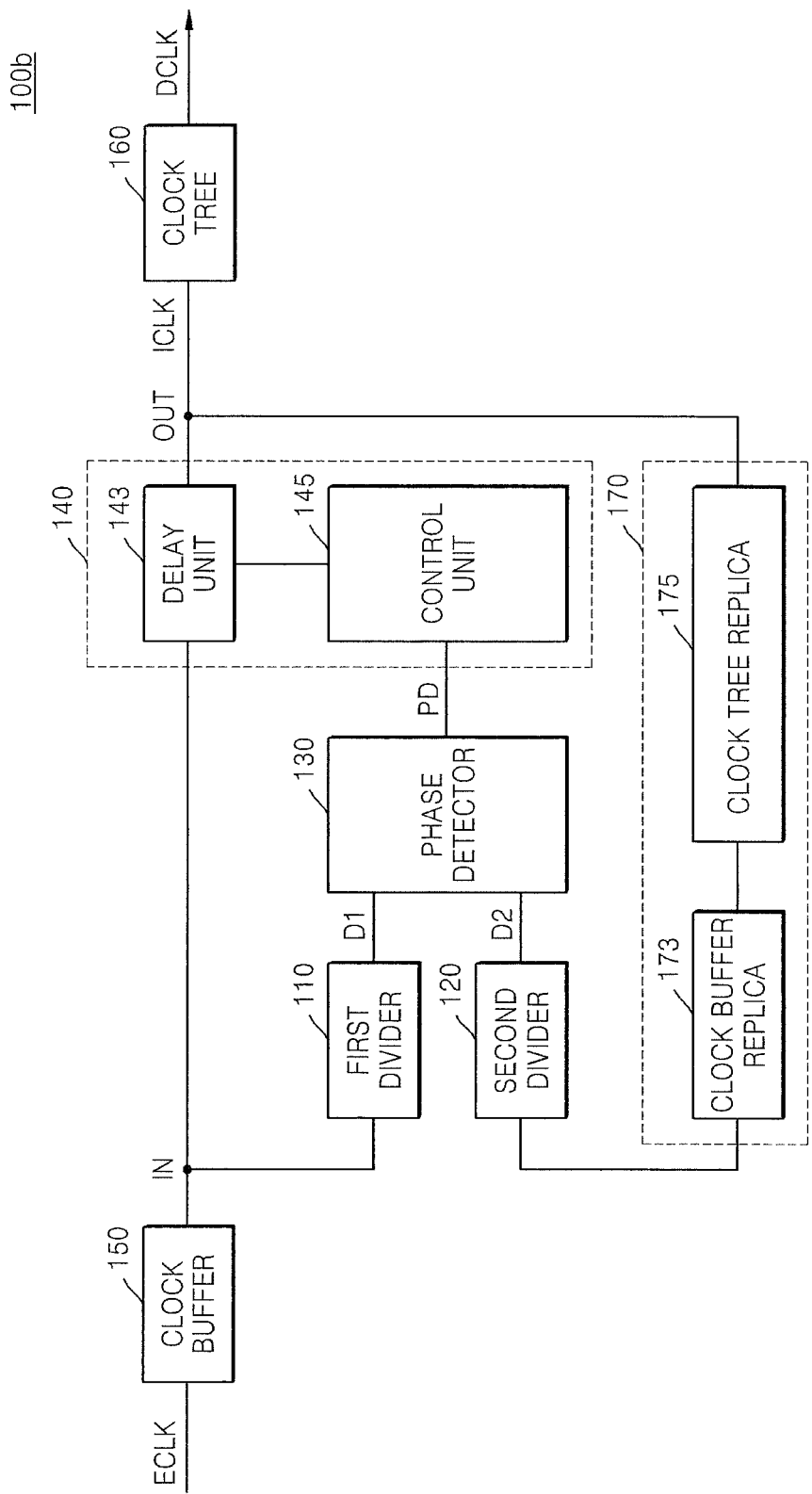
FIGS. 6 and 7 are block diagrams of DLL circuits according to other embodiments of the inventive concepts.
Figure 7:
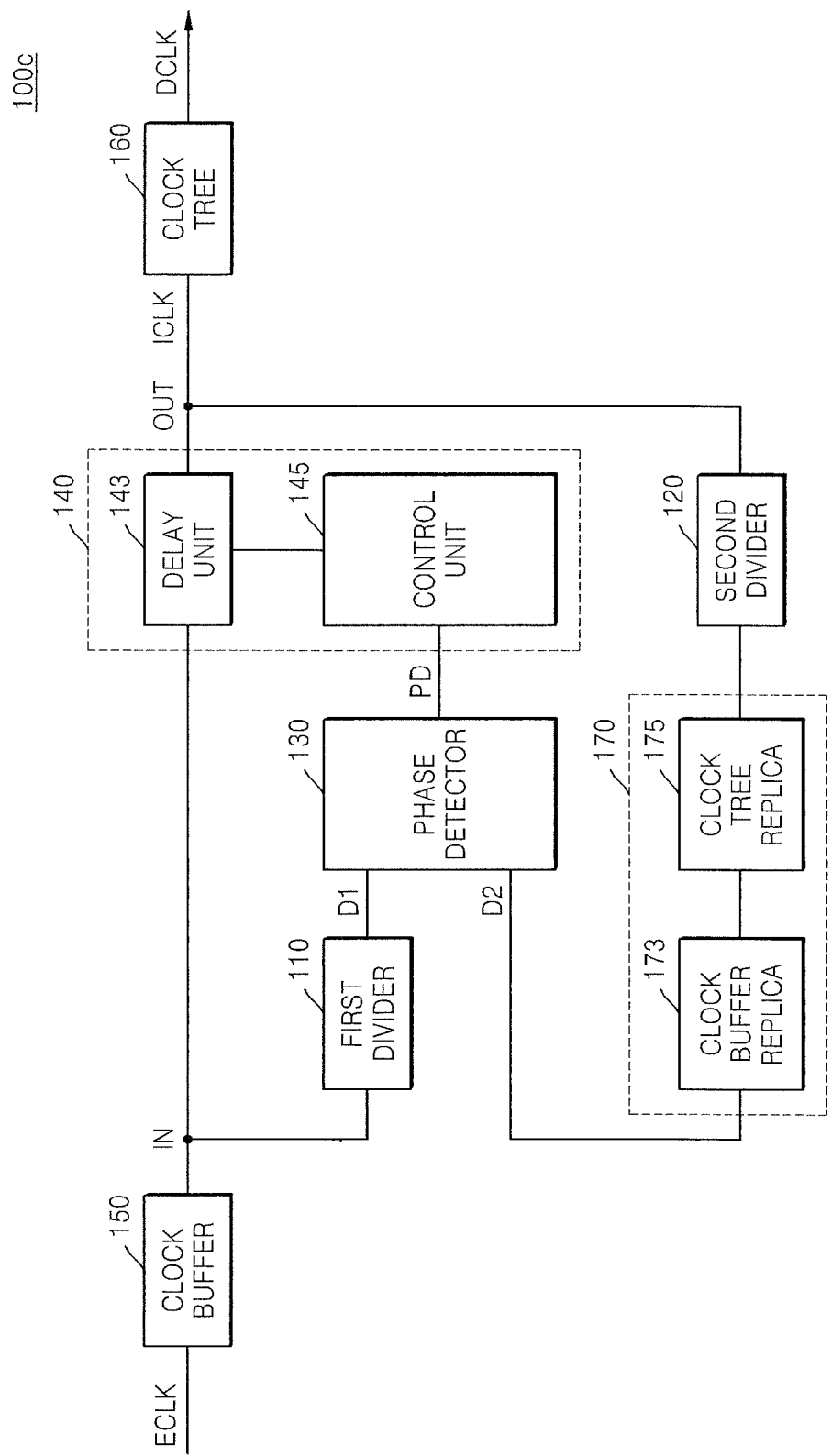

FIGS. 6 and 7 are block diagrams of DLL circuits 100b and 100c according to embodiments of the inventive concepts. The DLL circuits 100b and 100c may be modified examples of the DLL circuit 100a of FIG. 1. Thus, repeated descriptions of redundant features among the embodiments are omitted.

Referring to FIG. 6, the DLL circuit 100b may include a first divider 110, a second divider 120, a phase detector 130, an adjusting unit 140, a clock buffer 150, a clock tree 160, and a replica unit 170. The first divider 110, the second divider 120, the phase detector 130, and the adjusting unit 140 of FIG. 6 are the same as those described above with reference to FIG. 1, and thus, detailed descriptions thereof are omitted here.

The clock buffer 150 may buffer an external clock ECLK. For example, the clock buffer 150 may temporarily store the external clock ECLK and then may transmit the external clock ECLK to the first divider 110 and the adjusting unit 140.

The clock tree 160 is a circuit capable of controlling a skew between clock signals and may be connected to an output terminal OUT of the DLL circuit 100b. The clock tree 160 may output a DLL clock DCLK in response to an internal clock ICLK. For example, the DLL clock DCLK may be a signal obtained by delaying the internal clock ICLK.

The replica unit 170 may delay the internal clock ICLK. In more detail, the replica unit 170 may delay the internal clock ICLK by a delay due to the clock buffer 150 and the clock tree 160. For example, the replica unit 170 may include a clock buffer replica 173 that is formed to delay the internal clock ICLK by a delay due to the clock buffer 150, and a clock tree replica 175 that is formed to delay the internal clock ICLK by a delay due to the clock tree 160.

As illustrated in FIG. 6, the replica unit 170 may be connected between the output terminal OUT and the second divider 120. For example, the second divider 120 may be connected between the phase detector 130 and the replica unit 170. In this case, an internal clock ICLK may be delayed by the replica unit 170, and the delayed internal clock ICLK may be divided by the second divider 120, so that a second divided signal D2 may be generated.

Alternatively, as illustrated in FIG. 7, the replica unit 170 may be connected between the second divider 120 and the phase detector 130. In this case, an internal clock ICLK may be divided by the second divider 120, and the divided internal clock ICLK may be delayed by the replica unit 170, so that a second divided signal D2 may be generated. In particular, in the embodiment of FIG. 7, the internal clock ICLK that is divided by the second divider 120 is delayed by the replica unit 170, so that toggling times of a signal that is input to the replica unit 170 may be decreased, and thus, power consumption may be reduced.

Figure 8:
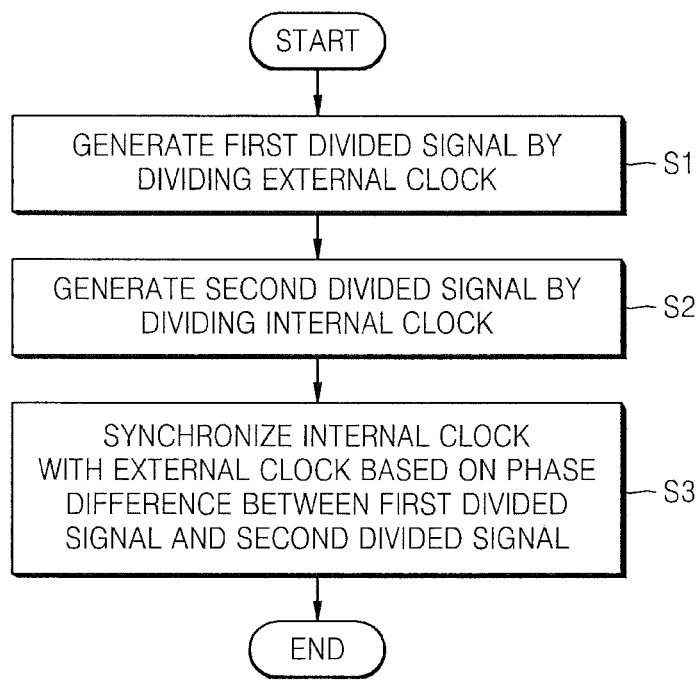
FIG. 8 is a flowchart of a method of operating a DLL circuit, according to an embodiment of the inventive concepts.
Figure 9:
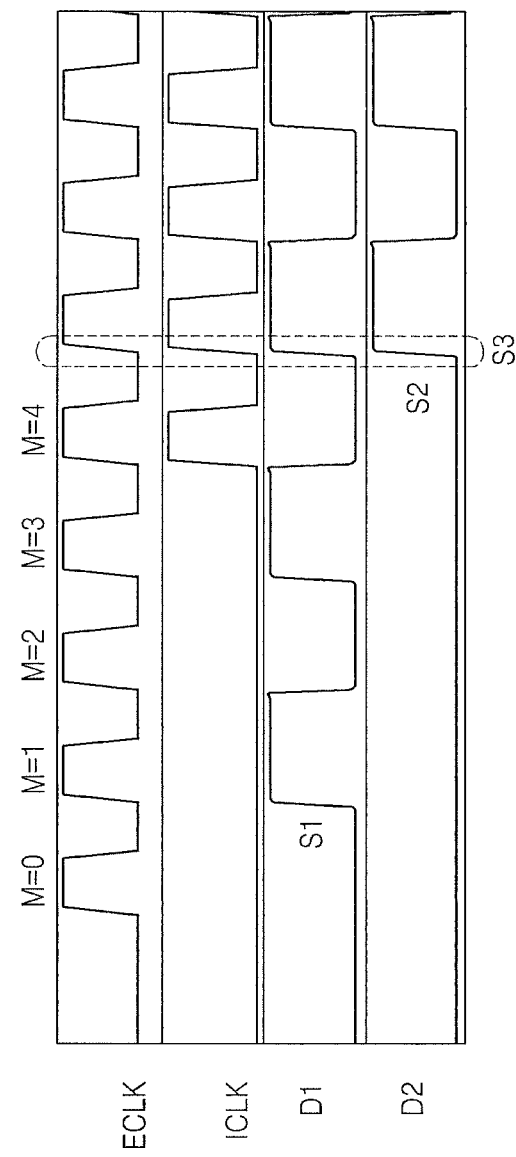
FIG. 9 is a timing diagram of signals obtained by performing the method of FIG. 8.

FIG. 8 is a flowchart of a method of operating a DLL circuit, according to an embodiment of the inventive concepts. FIG. 9 is a timing diagram of signals obtained by performing the method of FIG. 8. The method of FIG. 8 may be performed by using the DLL circuit 100a of FIG. 1.

Referring to FIGS. 1, 8, and 9, a first divided signal D1 is generated by dividing an external clock ECLK (operation S1). A second divided signal D2 is generated by dividing an internal clock ICLK (operation S2). Afterward, the internal clock ICLK and the external clock ECLK are synchronized based on a phase difference PD between the first divided signal D1 and the second divided signal D2 (operation S3).

The method according to the present embodiment performs a synchronization operation, based on the first divided signal D1 obtained by dividing the external clock ECLK, and the second divided signal D2 obtained by dividing the internal clock ICLK. Thus, it is possible to prevent a latency problem that may occur due to a delay increase or a delay decrease of the internal clock ICLK. As a result, clock latency may be maintained even if low frequency noise causes the delay increase or the delay decrease.

Figure 10:
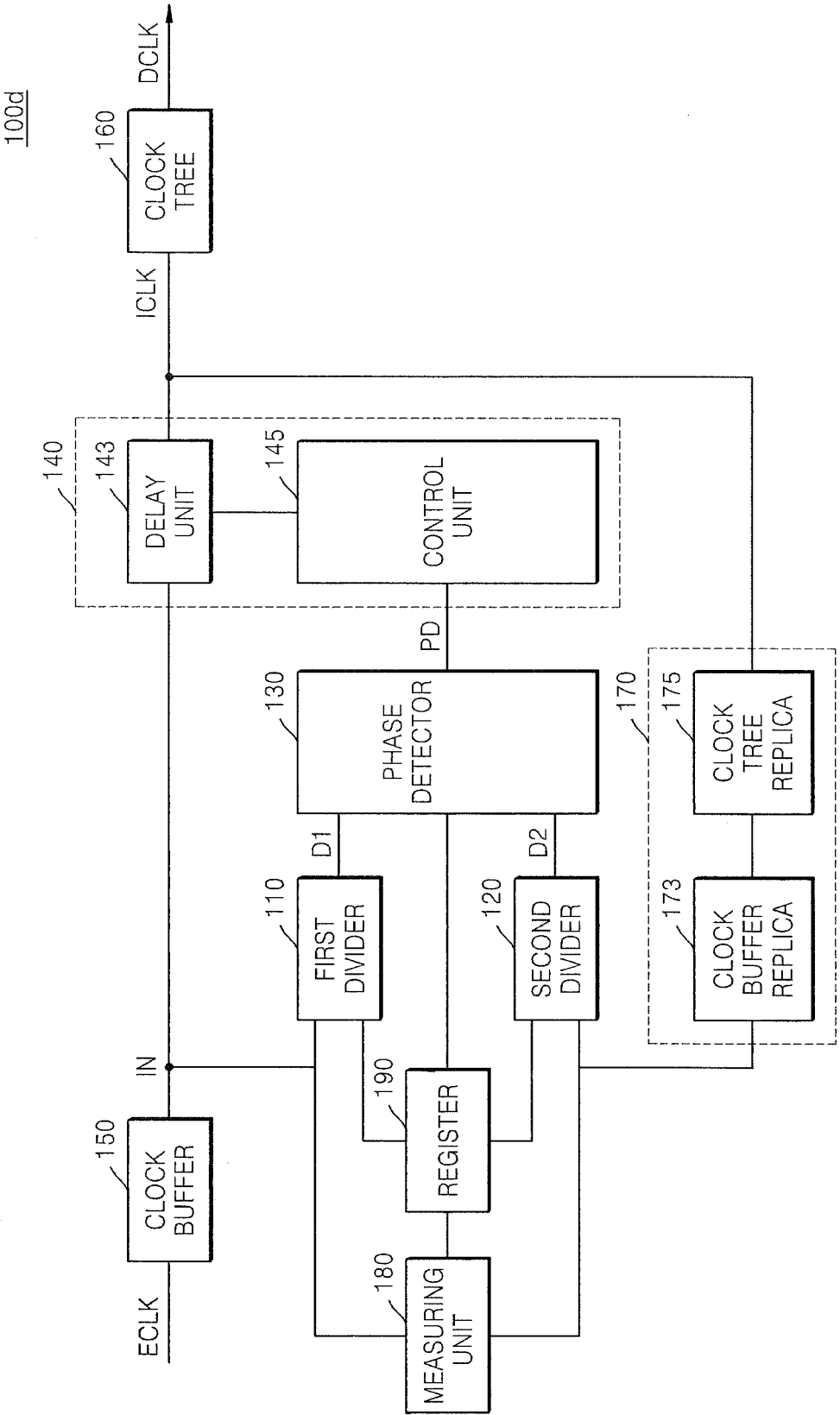
FIG. 10 is a block diagram of a DLL circuit according to another embodiment of the inventive concepts.

FIG. 10 is a block diagram of a DLL circuit 100d according to another embodiment of the inventive concepts. The DLL circuit 100d may be a modified example of the DLL circuit 100b of FIG. 6. Hereinafter, repeated descriptions of redundant features among the embodiments are omitted.

Referring to FIG. 10, the DLL circuit 100d may include a first divider 110, a second divider 120, a phase detector 130, an adjusting unit 140, a clock buffer 150, a clock tree 160, a replica unit 170, a measuring unit 180, and a register 190. The first divider 110, the second divider 120, the phase detector 130, the adjusting unit 140, the clock buffer 150, the clock tree 160, and the replica unit 170 of FIG. 10 are the same as those described above with reference to FIG. 6, and thus, detailed descriptions thereof are omitted here.

The first divider 110 may divide an external clock ECLK by 1 in an initial mode and may divide the external clock ECLK by M in a normal mode. Also, the second divider 120 may divide an internal clock ICLK by 1 in an initial mode and may divide the internal clock ICLK by M in a normal mode. Here, the M may correspond to a time difference between generation or evanescence of the external clock ECLK and generation or evanescence of the internal clock ICLK, and may be determined by the measuring unit 180.

The measuring unit 180 may measure information regarding the time difference by measuring the generation or evanescence of the external clock ECLK and the generation or evanescence of the internal clock ICLK, and may determine and generate the M. In more detail, FIGS. 11 and 12 illustrate a process in which the M is determined by the measuring unit 180.

Figure 11:
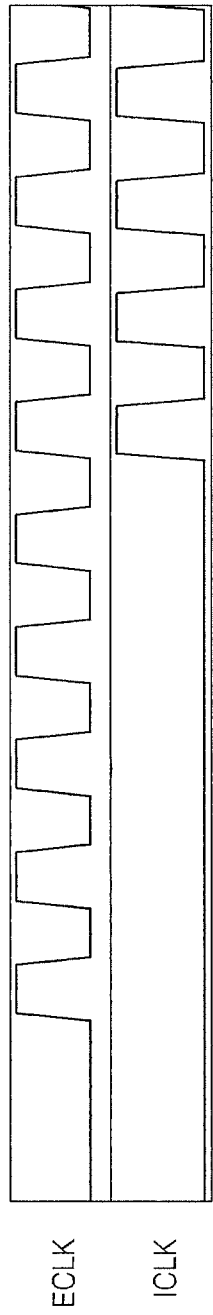
FIGS. 11 and 12 illustrate clock waveforms used to calculate a time difference between generation or evanescence of an external clock and generation or evanescence of an internal clock.

As illustrated in FIG. 11, the measuring unit 180 may measure the generation of the external clock ECLK and the generation of the internal clock ICLK. Also, according to a result of the measurement, the measuring unit 180 may generate information regarding a time difference between the generation of the external clock ECLK and the generation of the internal clock ICLK (e.g., a time difference that corresponds to 5 clock periods), and may determine M as a value that is obtained by dividing the time difference by a clock period of an external (or internal) clock (e.g., M=5).

Figure 12:
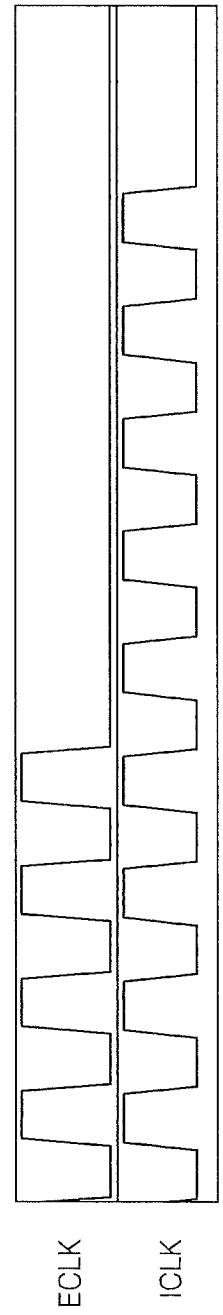

Also, as illustrated in FIG. 12, the measuring unit 180 may measure the evanescence of the external clock ECLK and the evanescence of the internal clock ICLK. According to a result of the measurement, the measuring unit 180 may generate information regarding a time difference between the evanescence of the external clock ECLK and the evanescence of the internal clock ICLK (e.g., a time difference that corresponds to 5 clock periods), and may determine M as a value that is obtained by dividing the time difference by a clock period of an external (or internal) clock (e.g., M=5).

The register 190 may temporarily store the M. The first divider 110 may receive the M from the register 190 and then may divide the external clock ECLK by the M. Also, the second divider 120 may receive the M from the register 190 and then may divide the internal clock ICLK by the M.

Figure 13:
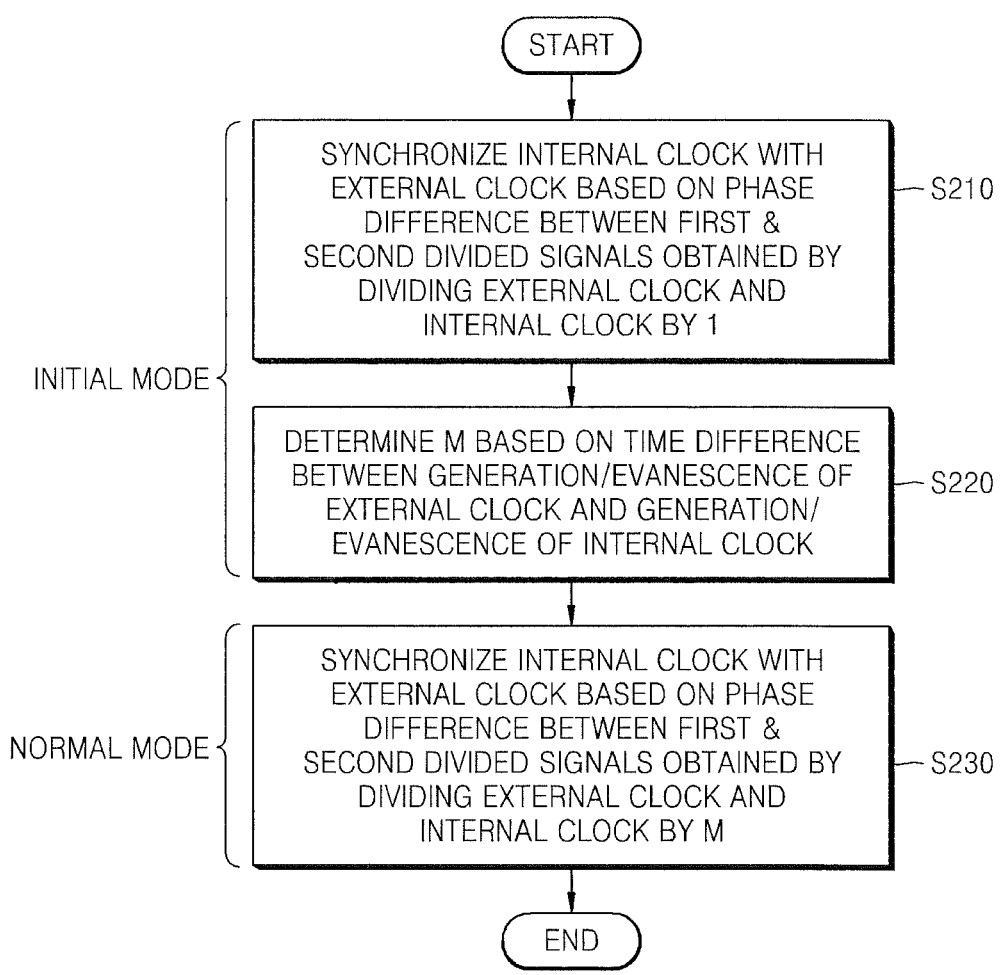
FIG. 13 is a flowchart of a method of operating a DLL circuit, according to another embodiment of the inventive concepts.

A method of operating the DLL circuit 100d of FIG. 10 will be illustrated in FIG. 13. FIG. 13 is a flowchart of a method of operating a DLL circuit, according to another embodiment of the inventive concepts.

Referring to FIGS. 10 and 13, in an initial mode, an internal clock ICLK and an external clock ECLK are synchronized based on a phase difference PD between a first divided signal D1 obtained by dividing the external clock ECLK by 1, and a second divided signal D2 obtained by dividing the internal clock ICLK by 1 (operation S210). Afterward, as described with reference to FIGS. 11 and 12, M is determined based on a time difference between generation (or evanescence) of the external clock ECLK and generation (or evanescence) of the internal clock ICLK (operation S220). The determined M may be stored in the register 190.

In a normal mode, an internal clock ICLK and an external clock ECLK are synchronized based on a phase difference PD between a first divided signal D1 obtained by dividing the external clock ECLK by M, and a second divided signal D2 obtained by dividing the internal clock ICLK by M (operation S230). In order to perform a synchronization operation (operation S230) in the normal mode, operations S1, S2, and S3 of FIG. 8 may be performed. The synchronization operation (operation S230) will be described in detail with reference to FIG. 14.

Figure 14:
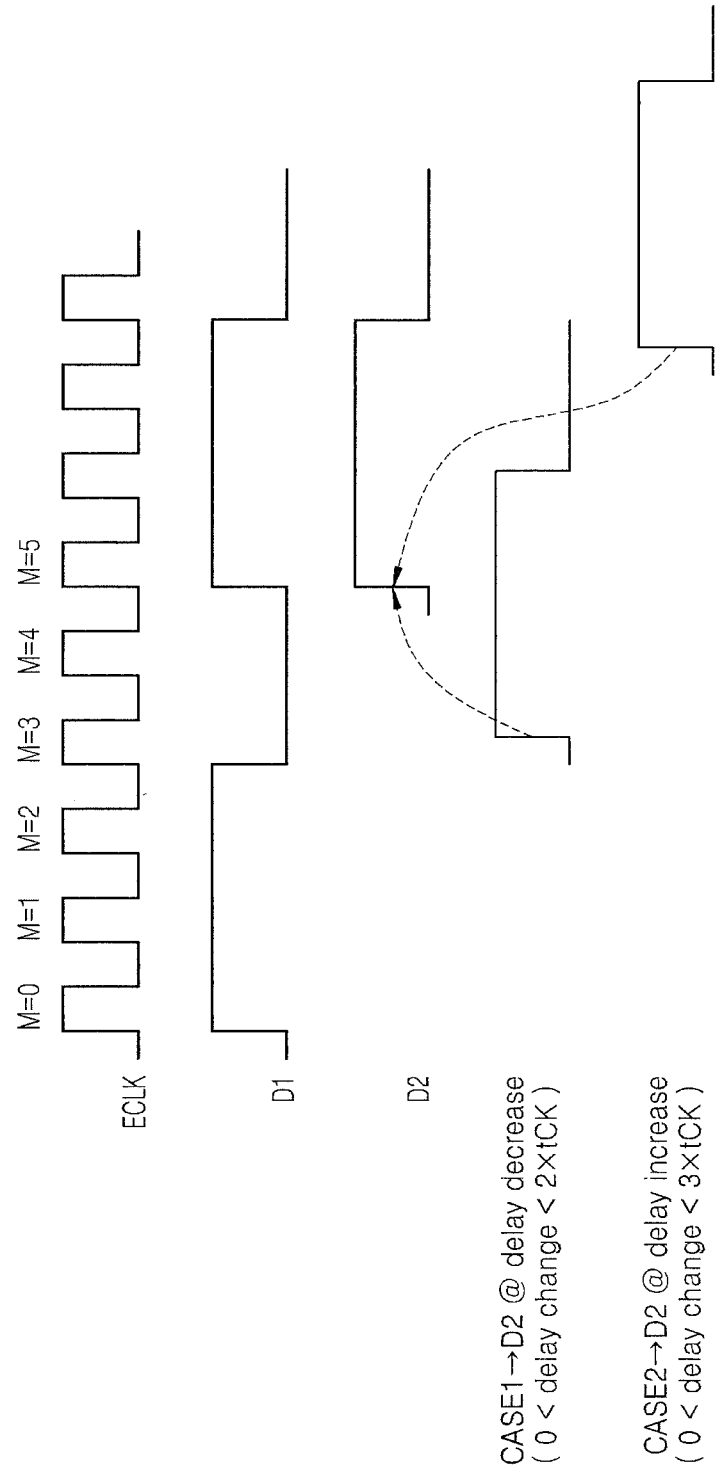
FIG. 14 illustrates a synchronization operation performed in a normal mode of a method of operating a DLL circuit, according to an embodiment of the inventive concepts.

Referring to FIG. 14, the first divided signal D1 and the second divided signal D2 may be synchronized at an M+1th rising edge of the external clock ECLK. For example, in a case of M=5 in operation S220, the first divided signal D1 and the second divided signal D2 may be synchronized at a sixth rising edge of the external clock ECLK.

In the CASE 1, although a delay decrease of the internal clock ICLK occurs, and the delay decrease is less than double of a clock period of an external (or internal) clock (which would provide a correct status of the internal clock ICLK), a latency problem does not occur. Because a result value obtained by latching (or sampling) the first divided signal D1 at a first rising edge of the second divided signal D2 obtained by dividing the internal clock ICLK is '0', it may be determined that a phase of the internal clock ICLK is slower than a phase of the external clock ECLK. In contrast, if the external clock ECLK is latched or sampled, a false '1' would be generated, resulting in the internal clock ICLK being delayed further in an attempt to synchronize the internal clock ICLK with the external clock ECLK. Thus, by using the divided clock signals, a first edge of the second divided signal D2 (and the internal clock ICLK) may be synchronized at an M=5 point of the first divided signal D1 (and the external clock ECLK) (i.e., the sixth edge of the external clock ECLK), and as a result, latency may be maintained.

In the CASE 2, although a delay increase of the internal clock ICLK occurs, and the delay increase is less than triple of the clock period of the external (or internal) clock (which would provide a correct status of the internal clock ICLK), a latency problem does not occur. Because the result value obtained by latching (or sampling) the first divided signal D1 at the first rising edge of the second divided signal D2 obtained by dividing the internal clock ICLK is '1', it may be determined that the phase of the internal clock ICLK is faster than the phase of the external clock ECLK. In contrast, if the external clock ECLK is latched or sampled, a false '0' would be generated, resulting in the internal clock ICLK being further advanced in an attempt to synchronize the internal clock ICLK with the external clock ECLK. Thus, the first edge of the second divided signal D2 (and the internal clock ICLK) may be synchronized at the M=5 point of the first divided signal D1 (and the external clock ECLK) (i.e., the sixth edge of the external clock ECLK), and as a result, latency may be maintained.

Figure 15:
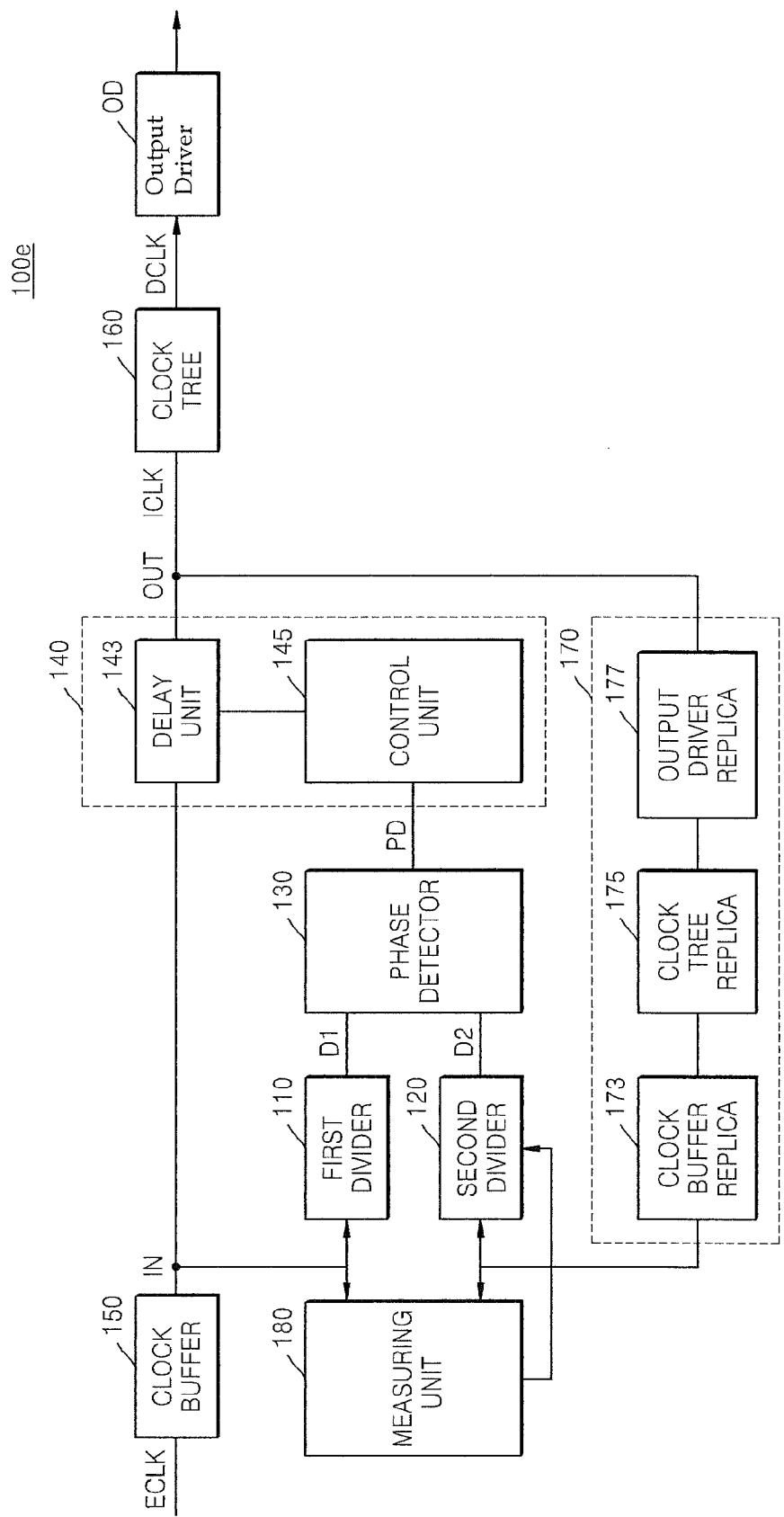
FIG. 15 is a block diagram of a DLL circuit according to another embodiment of the inventive concepts.

FIG. 15 is a block diagram of a DLL circuit 100e according to another embodiment of the inventive concepts. The DLL circuit 100e may be a modified example of the DLL circuit 100d of FIG. 10. Hereinafter, repeated descriptions of redundant features among the embodiments are omitted.

Referring to FIG. 15, the DLL circuit 100e may include a first divider 110, a second divider 120, a phase detector 130, an adjusting unit 140, a clock buffer 150, a clock tree 160, a replica unit 170, a measuring unit 180, and an output driver OD. The first divider 110, the second divider 120, the phase detector 130, the adjusting unit 140, the clock buffer 150, the clock tree 160, and the replica unit 170 of FIG. 15 are the same as those described above with reference to FIG. 6, and thus, detailed descriptions thereof are omitted here.

A DLL clock DCLK that is a signal obtained by delaying an internal clock ICLK by the clock tree 160 may be output via the output driver OD. In this case, the replica unit 170 may further include an output driver replica 177 so as to compensate for a signal delay due to the output driver OD.

The first divider 110 may divide an external clock ECLK by 1 in an initial mode and may divide the external clock ECLK by 2 in a normal mode. Also, the second divider 120 may divide an internal clock ICLK by 1 in an initial mode and may divide the internal clock ICLK by 2 in a normal mode.

The measuring unit 180 may measure generation or evanescence of the external clock ECLK and generation or evanescence of the internal clock ICLK, may generate information regarding a time difference (e.g., information regarding a time difference between the generation or the evanescence of the external clock ECLK and the generation or the evanescence of the internal clock ICLK), may determine whether a value that is obtained by dividing the time difference by a clock period of an external (or internal) clock is an even number or an odd number, and then may control the second divider 120.

In a case where the value obtained by dividing the time difference by the clock period of the external (or internal) clock is an even number, the measuring unit 180 may control the second divider 120 to generate a signal, which is obtained by dividing the internal clock ICLK by 2, as a second divided signal D2. Thus, in this case, a second divided signal D2 that is input to the phase detector 130 is the signal obtained by dividing the internal clock ICLK by 2, wherein the second divided signal D2 is illustrated in FIG. 17.

In a case where the value obtained by dividing the time difference by the clock period of the external (or internal) clock is an odd number, the measuring unit 180 may control the second divider 120 to generate a signal, which is inversion of a signal obtained by dividing the internal clock ICLK by 2, as a second divided signal D2. Thus, in this case, a second divided signal D2 that is input to the phase detector 130 is the inversion of the signal obtained by dividing the internal clock ICLK by 2, wherein the second divided signal D2 is illustrated in FIG. 18.

A method of operating the DLL circuit 100e of FIG. 15 will be illustrated in FIG. 16. FIG. 16 is a flowchart of a method of operating a DLL circuit, according to another embodiment of the inventive concepts.

Referring to FIGS. 15 and 16, in an initial mode, an internal clock ICLK and an external clock ECLK are synchronized based on a phase difference PD between a first divided signal D1 obtained by dividing the external clock ECLK by 1, and a second divided signal D2 obtained by dividing the internal clock ICLK by 1 (operation S310). Afterward, a value is determined by dividing a time difference between generation (or evanescence) of the external clock ECLK and generation (or evanescence) of the internal clock ICLK by a clock period of the external clock ECLK (or a clock period of the internal clock ICLK) (operation S320).

In the normal mode, a first divided signal D1 is generated by dividing the external clock ECLK by 2 (operation S1'). Afterward, it is determined whether the value M obtained in operation S320 is an even number. When the value M is an even number, a second divided signal D2 is generated by dividing the internal clock ICLK by 2 (operation S2'E). If it is determined M is an odd number, a second divided signal D2 is generated by inverting a signal obtained by dividing the internal clock ICLK by 2 (operation S2'O). Afterward, the internal clock ICLK and the external clock ECLK are synchronized based on a phase difference PD between the first divided signal D1 and the second divided signal D2 (operation S3').

FIGS. 17 and 18 are timing diagrams of signals obtained by performing the method of FIG. 16. The method of FIG. 16 may be performed by using the DLL circuit 100e of FIG. 15.

As illustrated in FIG. 17, when a value obtained by dividing the time difference between generation (or evanescence) of the external clock ECLK and generation (or evanescence) of the internal clock ICLK by a clock period of the external clock ECLK is an even number, the first divided signal D1 is generated by dividing the external clock ECLK by 2 (S1). The second divided signal D2 is generated by inverting the signal obtained by dividing the internal clock ICLK by 2 (S2E'). The internal clock ICLK and the external clock are synchronized based on the phase difference PD between the first divided signal D1 and the second divided signal D2 (S3').

On the other hand, as illustrated in FIG. 18, when the value obtained by dividing the time difference between the generation (or evanescence) of the external clock ECLK and the generation (or evanescence) of the internal clock ICLK by the clock period of the external clock ECLK is an odd number, the first divided signal D1 is generated by dividing the external clock ECLK by 2 (S1). The first divided signal D2 is generated by inverting the signal obtained by dividing the internal clock ICLK by 2 (operation S2'0). The internal clock ICLK and the external clock ECLK are synchronized based on the phase difference PD between the first divided signal D1 and the second divided signal D2 (S3').

Figure 19:
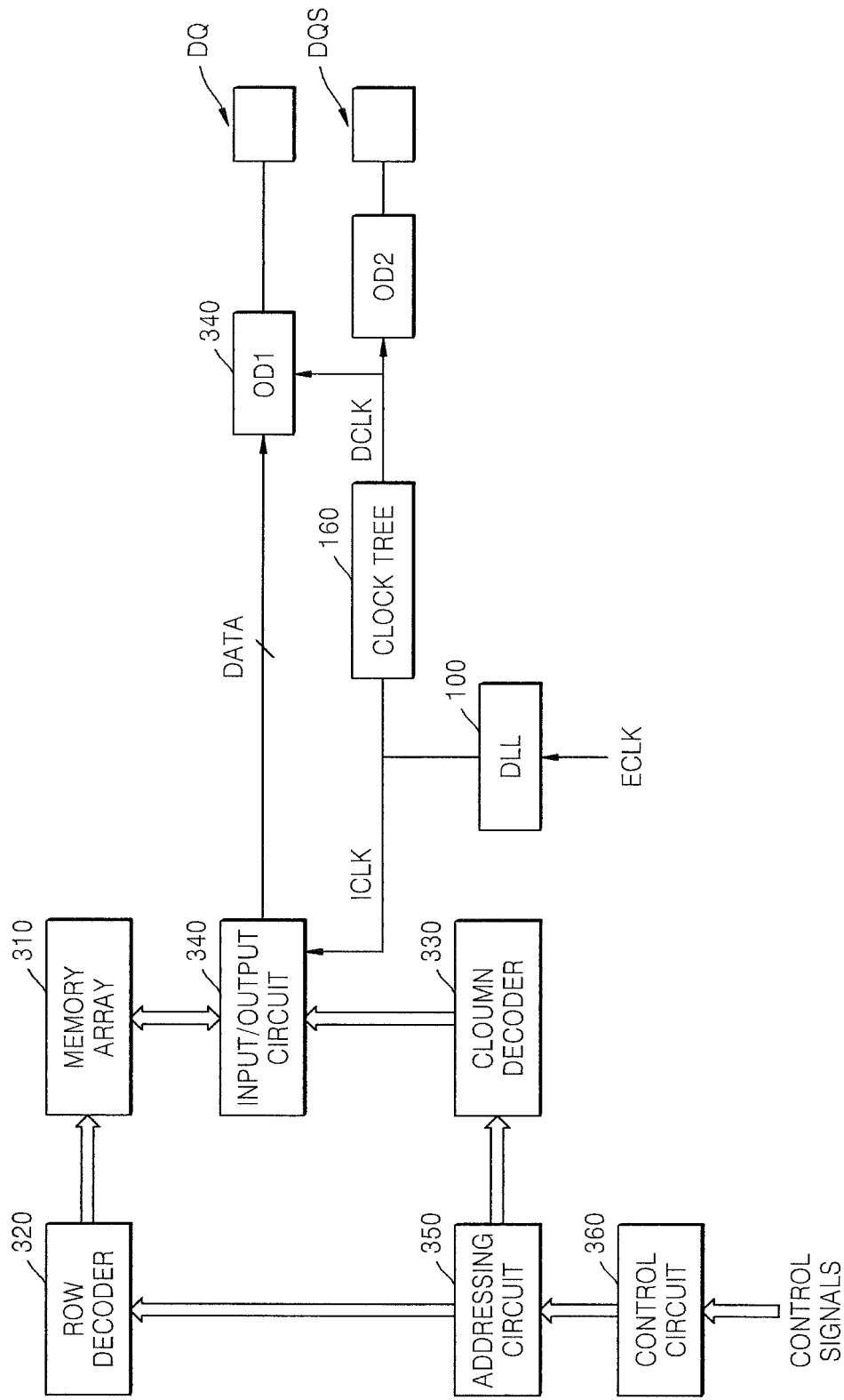
FIG. 19 is a block diagram of a semiconductor memory device including a DLL circuit according to an embodiment of the inventive concepts.

FIG. 19 is a block diagram of a semiconductor memory device according to an embodiment of the inventive concepts.

Referring to FIG. 19, the semiconductor memory device may include a DLL circuit 100, a memory array 310, a row decoder 320, a column decoder 330, an input/output circuit 340, an addressing circuit 350, and a control circuit 360.

The memory array 310 may include a plurality of word lines, a plurality of bit lines, and a plurality of memory cells connected between the plurality of word lines and the plurality of bit lines. Each of the plurality of memory cells may be embodied as a volatile memory cell such as a DRAM or an SDRAM.

Also, each of the plurality of memory cells may be embodied as a non-volatile memory cell included in a phase change RAM, a nano floating gate memory (NFGM), a polymer RAM (PoRAM), a magnetic RAM (MRAM), a ferroelectric RAM (FeRAM), a resistive RAM (RRAM), a nanotube RRAM, a holographic memory, a molecular electronics memory device, or an insulator resistance change memory. The non-volatile memory cell may store one bit or a plurality of bits.

The row decoder 320 may receive a row address output from the addressing circuit 350, may decode the received row address, and then may select one of the plurality of word lines. The column decoder 330 may receive a column address output from the addressing circuit 350, may decode the received column address, and then may select one of the plurality of bit lines.

The input/output circuit 340 may write data to at least one memory cell selected by the row decoder 320 and the column decoder 330. Also, the input/output circuit 340 may read data stored in at least one memory cell selected by the row decoder 320 and the column decoder 330. The input/output circuit 340 may include a plurality of sense amplifiers for sensing and amplifying data that is read in a read operation, and one or more output drivers (e.g., a first output driver OD1) for driving data to be written in a write operation.

The addressing circuit 350 may generate the row address and the column address, in response to a control by the control circuit 360. The control circuit 360 may generate a plurality of operation control signals for controlling operations of the addressing circuit 350 in response to a plurality of control signals that are required to perform a write operation or a read operation.

The DLL circuit 100 may transmit an internal clock ICLK that is synchronized with an external clock ECLK to the input/output circuit 340. The input/output circuit 340 may input and output data in response to the internal clock ICLK. For example, a data signal DATA may be transmitted to the first output driver OD1, in response to the internal clock ICLK. Therefore, data transmitted by the input/output circuit 340 in response to the internal clock ICLK, may be synchronized with the external clock ECLK.

The first output driver OD1 may transmit the data signal DATA to a first pad DQ, in response to a DLL clock DCLK. Thus, the write or read operation with respect to data may be performed while being synchronized with the DLL clock DCLK. Also, a second output driver OD2 may transmit the DLL clock DCLK to a second pad DQS. The first pad DQ and the second pad DQS may be pads of a semiconductor chip included in the semiconductor memory device and may be arrayed as center pads or edge pads on the semiconductor chip.

Figure 20:
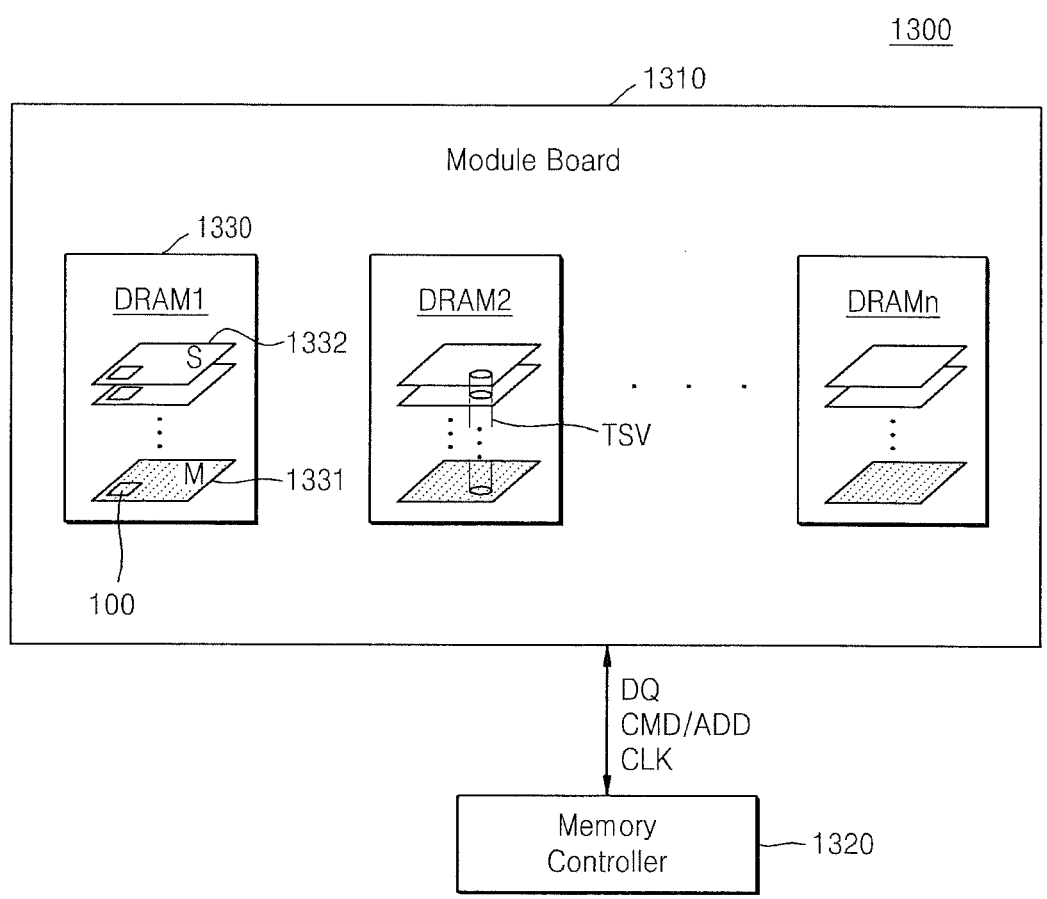
FIG. 20 is a diagram of a memory system including the semiconductor memory device of FIG. 19, according to an embodiment of the inventive concepts.

FIG. 20 is a diagram of a memory system 1300 including the semiconductor memory device of FIG. 19, according to an embodiment of the inventive concepts.

Referring to FIG. 20, the memory system 1300 may include a memory module 1310 and a memory controller 1320. The memory module 1310 may have one or more semiconductor memory devices 1330 mounted on a module board. The semiconductor memory device 1330 may be embodied as a DRAM chip and each of the semiconductor memory devices 1330 may include a plurality of semiconductor layers. Each of the semiconductor layers may include one or more master chips 1331 and one or more slave chips 1332. A signal may be transmitted between the semiconductor layers via a through silicon via TSV. Alternatively, a signal may be transmitted between the semiconductor layers via optical input/output connection.

Each master chip 1331 and each slave chip 1332 according to the present embodiment may include a memory array, a storage unit, and a refresh unit. Also, each master chip 1331 and each slave chip 1332 may further include a test unit and a DLL circuit 100.

The memory module 1310 may perform communication with the memory controller 1320 via a system bus. Data DQ, command/address CMD/ADD, a clock signal CLK, and the like may be exchanged between the memory module 1310 and the memory controller 1320 via the system bus. The signal transmission between the memory module 1310 and the memory controller 1320 via the system bus may be performed via optical input/output connection.

Figure 21:
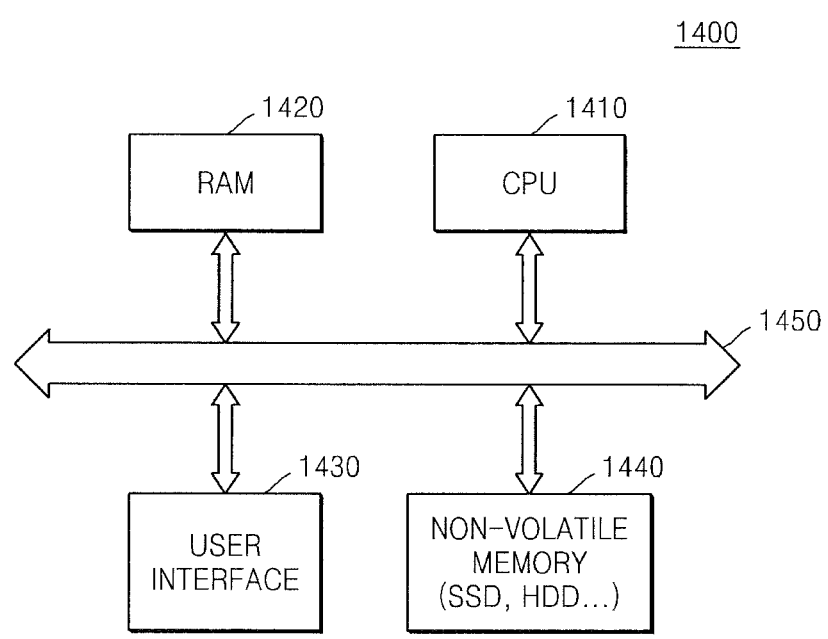
FIG. 21 is a block diagram of a computing system including a memory system (e.g. the memory system of FIG. 20), according to an embodiment of the inventive concepts.

FIG. 21 is a block diagram of a computing system 1400 including a memory system (e.g., the memory system 1300 of FIG. 20), according to an embodiment of the inventive concepts.

Referring to FIG. 21, a semiconductor memory device according to the one or more embodiments of the inventive concepts may be mounted as a RAM 1420 in the computing system 1400 such as a mobile device, a desk top computer, or the like. The semiconductor memory device mounted as the RAM 1420 may be one of the aforementioned embodiments of the inventive concepts. For example, the RAM 1420 may be formed as the semiconductor memory device according to the one or more embodiments of the inventive concepts or may be formed as a memory module. Also, the RAM 1420 may include the semiconductor memory device and a memory controller.

The computing system 1400 includes a central processing unit (CPU) 1410, the RAM 1420, a user interface 1430, and a non-volatile memory 1440 that are electrically connected to a bus 1450. The non-volatile memory 1440 may be formed as a large storage capacity device such as a solid state disk (SSD) or a hard disk drive (HDD).

While the inventive concepts has been particularly shown and described with reference to example embodiments thereof, it will be understood that various changes in form and details may be made therein without departing from the spirit and scope of the following claims.

What is claimed is:

1. A delay locked loop (DLL) circuit comprising:
    a first divider configured to generate a first divided signal by dividing an external clock by M;
    a second divider configured to generate a second divided signal by dividing an internal clock by M;
    a phase detector configured to detect a phase difference between the first divided signal and the second divided signal; and
    an adjusting unit configured to synchronize the internal clock and the external clock, based on the phase difference, wherein
    a value of M corresponds to a time difference between generation or evanescence of the external clock and generation or evanescence of the internal clock.

2. The DLL circuit of claim 1, wherein the first divider divides the external clock by a same division value that the second divider divides the internal clock.

3. The DLL circuit of claim 1, wherein the first divider is configured to generate the first divided signal by dividing the external clock by M, and
    the second divider is configured to generate the second divided signal by dividing the internal clock by M, wherein M is a natural number greater than 2.

4. The DLL circuit of claim 3, wherein the first divided signal and the second divided signal are synchronized at an $M+1^{th}$ rising edge of the external clock.

5. The DLL circuit of claim 1, wherein the first divider is configured to divide the external clock by 1 in an initial mode and the first divider is configured to divide the external clock by M in a normal mode, and
    the second divider is configured to divide the internal clock by 1 in the initial mode and the second divider is configured to divide the internal clock by M in the normal mode.

6. The DLL circuit of claim 3 further comprising a measuring unit configured to,
    generate the value of M using information regarding the time difference by measuring the generation or the evanescence of the external clock and the generation or the evanescence of the internal clock, and
    send the value of M to the first divider and the second divider, wherein the first divider is configured to divide the external clock by the M, and
    the second divider is configured to divide the internal clock by the M.

7. The DLL circuit of claim 1, wherein the adjusting unit comprises:
    a delay unit configured to generate the internal clock as a delayed version of the external clock; and a control unit configured to control the delay unit based on the phase difference.

8. The DLL circuit of claim 1, further comprising:
a replica unit configured to delay the internal clock.

9. The DLL circuit of claim 8, wherein the replica unit is connected between the phase detector and the second divider.

10. The DLL circuit of claim 8, wherein the second divider is connected between the phase detector and the replica unit.

11. The DLL circuit of claim 8, further comprising:
a clock tree configured to generate a DLL clock as a delayed version of the internal clock, wherein
the replica unit comprises a clock tree replica configured to delay the internal clock by a delay equal to a delay of the clock tree.

12. A semiconductor memory device comprising:
a delay locked loop (DLL) circuit configured to generate an internal clock synchronized with an external clock at an output terminal; and
an input/output circuit configured to input and output data, in response to the internal clock,
wherein the DLL circuit includes,
a first divider configured to generate a first divided signal by dividing an external clock by M;
a second divider configured to generate a second divided signal by dividing an internal clock by M;
a phase detector configured to detect a phase difference between the first divided signal and the second divided signal; and
an adjusting unit configured to synchronize the internal clock and the external clock, based on the phase difference, wherein
a value of M corresponds to a time difference between generation or evanescence of the external clock and generation or evanescence of the internal clock.

13. The semiconductor memory device of claim 12, wherein the first divider is configured to generated the first divided clock signal by dividing the external clock by 1 in an initial mode and the first divider is configured to generate the first divided clock signal by dividing the external clock by 2 in a normal mode, and
the second divider is configured to generate the second divided clock signal by dividing the internal clock by 1 in the initial mode and the second divider is configured to generate the second divided clock signal by dividing the internal clock by 2 in the normal mode.

14. The semiconductor memory device of claim 13, wherein,
the second divider is configured to generate the second divided signal, in the normal mode, by dividing the internal clock by 2, if a value obtained by dividing a time difference between generation or evanescence of the external clock and generation or evanescence of the internal clock by a clock period of the external clock is an even number, and
the second divider is configured to generate the second divided signal by inverting a signal obtained by dividing the internal clock by 2, if the value that is obtained by dividing the time difference between the generation or the evanescence of the external clock and the generation or the evanescence of the internal clock by the clock period of the external clock is an odd number.

15. A delay locked loop (DLL) circuit configured to receive an external clock and output an internal clock, the DLL circuit comprising:
a divider configured to divide an operating period of the external clock by M to generate a first divided clock signal and the divider is configured to divide an operating period of the internal clock by M to generate a second divided clock signal;
a phase detector configured to detect a phase difference between the first divided signal and the second divided signal; and
an adjusting unit configured to synchronize the internal clock and the external clock by adjusting a phase of the internal clock based on the phase difference between the first divided clock signal and the second divided clock signal, wherein
a value of M corresponds to a time difference between generation or evanescence of the external clock and generation or evanescence of the internal clock.

16. The DLL circuit of claim 15, wherein the divider is configured to divide the operating period of the external clock by a value and the divider is configured to divide the operating period of the internal clock by the value, the value being a natural number greater than 2.

17. The DLL circuit of claim 15, wherein the divider is configured to divide the operating period of the external clock by a value that corresponds to a time difference between the external clock and the internal clock.

18. The DLL circuit of claim 17, wherein the adjusting unit is configured synchronize the first divided signal and the second divided signal at the value+$1^{th}$ rising edge of the external clock.

19. The DLL circuit of claim 15, wherein the adjusting unit adjusts the phase of the internal clock by delaying or advancing the phase of the internal clock.

* * * * *